United States Patent
Jimarez et al.

[11] Patent Number: 5,920,037
[45] Date of Patent: Jul. 6, 1999

[54] CONDUCTIVE BONDING DESIGN FOR METAL BACKED CIRCUITS

[75] Inventors: Lisa Jeanine Jimarez, Newark Valley, N.Y.; David Noel Light, Friendsville, Pa.; Andrew Michael Seman, Kirkwood; David Brian Stone, Owego, both of N.Y.

[73] Assignee: International Business Machines Corporation, Armonk, N.Y.

[21] Appl. No.: 08/855,812

[22] Filed: May 12, 1997

[51] Int. Cl.⁶ .................................................. H05K 3/38
[52] U.S. Cl. .............................................................. 174/259
[58] Field of Search ................................. 174/252, 259, 174/250, 255, 256, 258

[56] References Cited

U.S. PATENT DOCUMENTS

| | | |
|---|---|---|
| 3,911,169 | 10/1975 | Lesaicherre et al. . |
| 4,616,413 | 10/1986 | Iliou et al. . |
| 4,727,168 | 2/1988 | Yoshino et al. . |
| 4,770,953 | 9/1988 | Horiguci et al. ......................... 428/698 |
| 4,851,615 | 7/1989 | Butt ........................................ 174/68.5 |
| 4,963,425 | 10/1990 | Buchanan et al. . |
| 4,976,990 | 12/1990 | Bach et al. . |
| 5,021,296 | 6/1991 | Suzuki et al. ............................ 428/409 |
| 5,112,395 | 5/1992 | Ngo . |
| 5,172,301 | 12/1992 | Schneider . |
| 5,180,625 | 1/1993 | Wang et al. . |
| 5,210,941 | 5/1993 | Turek et al. . |
| 5,221,399 | 6/1993 | Sanborn et al. . |
| 5,355,280 | 10/1994 | Rothlingshofer et al. . |
| 5,362,421 | 11/1994 | Kropp et al. . |
| 5,366,027 | 11/1994 | Turek et al. . |
| 5,432,303 | 7/1995 | Turek et al. . |
| 5,448,020 | 9/1995 | Pendse . |
| 5,455,738 | 10/1995 | Montesano et al. . |
| 5,490,895 | 2/1996 | Wang et al. . |
| 5,538,789 | 7/1996 | Capote et al. . |
| 5,565,267 | 10/1996 | Capote et al. . |

FOREIGN PATENT DOCUMENTS 54081353 6/1979 Japan .

OTHER PUBLICATIONS

Handbook of Surface Preparation, by Richard C. Snogren, pp. 288–290, 1974.

Modelling and Measurements of Adhesive Strength of Thermal Coatings, by S. Amanda, H. Yamada, S. Yematsu, and Y. Saotome, presented at the International Thermal Spray Conference and Exposition, Orlando, Florida, pp. 915–920, May 28, 1992.

Process and Performance Advancements in Conductive Bonding of Circuit Cards to Aluminum Thick Metal Backers. Donald Farqunar, Michael Klodowski, Andy Seman and David Light, Sep. 29, 1996.

Methods To Electrically Connect Al Heat Sinks To Semiconductor Chip Packages—IBM Technical Disclosure Bulletin vol. 35 No. 1A Jun. 1992.

Process for Improved Photoresist to Polyimide Adhesion–Reproduced from Research Disclosure, Dec. 1989, No. 308—Kenneth Mason Publications, Ltd. England.

Process for Enhanced Polyimide Adhesion—Reproduced from Research Disclosure, Feb. 1986, No. 262—Kenneth Mason Publications Ltd. England.

*Primary Examiner*—Kristine Kincaid
*Assistant Examiner*—William Silverio
*Attorney, Agent, or Firm*—William N. Hogg

[57] ABSTRACT

The present invention provides a new device and technique for enhancing the electrical properties of the thick metal backer/adhesive bond/ground plane interface. The enhanced electrical properties are obtained by micro-roughening a connection surface of the thick metal backer prior to forming the thick metal backer/adhesive bond/ground plane interface.

5 Claims, 2 Drawing Sheets

CONDUCTIVE BONDING DESIGN FOR METAL BACKED CIRCUITS

BACKGROUND OF THE INVENTION

The present invention relates to a device and method for forming an improved conductive interconnection between a voltage plane on the back side of a printed circuit card and a thick metal heat sink.

Many modern high power radio frequency or microwave applications require significant current carrying capability and/or significant thermal dissipation. To meet these needs, a thick metal backer ("TMB") is often connected to an external ground plane located on the surface of a printed circuit board ("PCB") to improve the electrical performance of the ground plane and also to provide a heat sink for thermal dissipation. Current methods for connecting such a thick metal back plate include sweat soldering, non-conductive adhesive bonding followed by plating through holes for electrical interconnection, gold coating the ground plane and applying a silicone adhesive which includes a mixture of silver particles, or by mechanical interconnection such as screws, rivets or soldered pins. Each of these methods have proven less than ideal as they tend to be too costly while compromising performance. Also, some of these methods result in poor reliability in the resulting circuit board assembly.

The sweat solder method entails soldering a conductive ground plane located on the back of a PCB onto a TMB. The resulting electrical performance is acceptable, because a highly conductive interface is formed. This interface allows for conductive interconnection across the entire ground plane. The reliability is less than ideal, however, due to the low compliance of the soldered interconnection. This low compliance results in the interconnection being unable to accommodate mechanical stress caused by the mismatch of the coefficient of thermal expansion of the PCB compared to that of the ground plane. Also, such sweat soldering is a complex and costly process prone to defects. Defects can occur in the bonding because the bond may reflow during subsequent processing.

Non-conductive adhesive or fusion bonding of the PCB to the TMB also is not ideal due to prohibitive cost, unreliable performance and complex manufacturing. Often, raw dielectric materials, for example polytetrafluoroethylene microwave laminates, are pre-bonded to a TMB of copper, brass or aluminum. The TMB is then discretely interconnected with the PCB using plated through holes or mechanical connecting means such as pressure-fitted or soldered pins. Such discrete electrical interconnects are less desirable than an area electrical interconnection due to compromised localized grounding.

Simple non-adhesive mechanical interconnection such as screws or rivets may also be used to join the PCB and TMB together but imperfect coplanarity between the PCB and TMB, coupled with localized thermal stresses tends to induce localized areas of non-contact, preventing global interconnection and changing the contact resistance over time. Also, resistance stability across the interface is less than desirable and ultimately may lead to failure of the device.

The mechanical and electrical stabilities of conductively-bonded interfaces between the ground plane on a PCB and the TMB have proven difficult to control. Typically, a TMB is formed of copper, brass or aluminum depending upon the need for electrical and thermal conductivity, weight, and ease of machining versus economic considerations. The bonding surface on the PCB is often provided with a copper, tin-lead, tin or gold finish. The TMB is typically aluminum, brass or copper. With the exception of gold, these metals are prone to oxidative, hydrolytic and corrosive processes. The processes lead to the formation of metal oxides, hydroxides and other corrosive products at the interface between the conductive adhesive and metal adherend which ultimately can compromise both the electrical and mechanical stability of the bonding and eventually, the performance and reliability of the packaging structure. This problem is particularly troublesome in humid environments, especially in the case of adhesively bonded aluminum.

Aluminum surfaces are normally protected by a thin layer of aluminum oxide that provides passivation of the metal at room temperature and moderate relative humidity. Although the native oxide of aluminum is a poor conductor, it is thin enough to allow a reasonably low contact resistance for conductive interconnections and typically resists further degradation of the electrical interconnection. However, experience has shown that PCB's conductively bonded to aluminum and exposed to higher values of temperature and humidity induce a transformation of the aluminum oxide ($Al_2O_3$) to aluminum oxyhydroxide (AlOOH) and finally, if the reaction is complete, aluminum hydroxide ($Al(OH)_3$). Aluminum hydroxide is mechanically weak, non-conductive and non-passivating (i.e., offers no further protection of the underlying aluminum/aluminum oxide from corrosion). This aluminum hydroxide can build up to significant thicknesses which can result in significant increases in interfacial resistance through the bond and to mechanical separation of the bonded surface. The rate of formation of the aluminum hydroxide is much greater under a conductive bonding adhesive, such as silver-filled epoxy, than for exposed aluminum, perhaps due to corrosive species in the adhesive resin, and/or to galvanic coupling between the silver in the adhesive and aluminum.

Roughening of surfaces by sandblasting, chemical etching or anodization has been commonly practiced to enhance adhesion of aluminum/polymer adhesive systems and to provide structural durability in humid or corrosive environments. However, when the bond itself must be electrically conductive, treatments that improve adhesion by producing a thick oxide layer, such as phosphoric acid or chromic acid anodization, are not suitable because of the poor electrical properties of the thick oxide layers. Sand blasted surfaces show some improvement in bond resistance stability, but still significant susceptability to hydrolysis and resistance increase in humid environments.

Accordingly, there is a need for new technology for fabricating reliable conductive interconnections between metal substrates, particularly aluminum substrates, and ground planes of printed circuit boards, especially when the resulting circuit board assembly is subject to humid environments over extended periods of time.

SUMMARY OF THE INVENTION

In accordance with the present invention, it has been found that micro-roughening a connection surface of a thick metal backer preceding application of an electrically conductive adhesive can reduce or even eliminate the increase in electrical resistance of a metal/adhesive bond when subjected to humid conditions.

Thus, the present invention provides a new design and technique for enhancing the electrical properties of the thick metal back/adhesive bond/ground plane interface obtained by micro-roughening the surface of the TMB. The technique comprises micro-roughening a connection surface of the TMB with an aqueous slurry applied under pressure to obtain a relatively uniform roughness and oxide layer across the connection surface of the TMB. The connection surface is then adhered to a pre-treated ground plane of the PCB with preferably an electrically conductive adhesive. The joining of the TMB to the ground plane is performed under pressure with the adhesive being cured to form a stable conductive bond.

DETAILED DESCRIPTION

Figure 1:
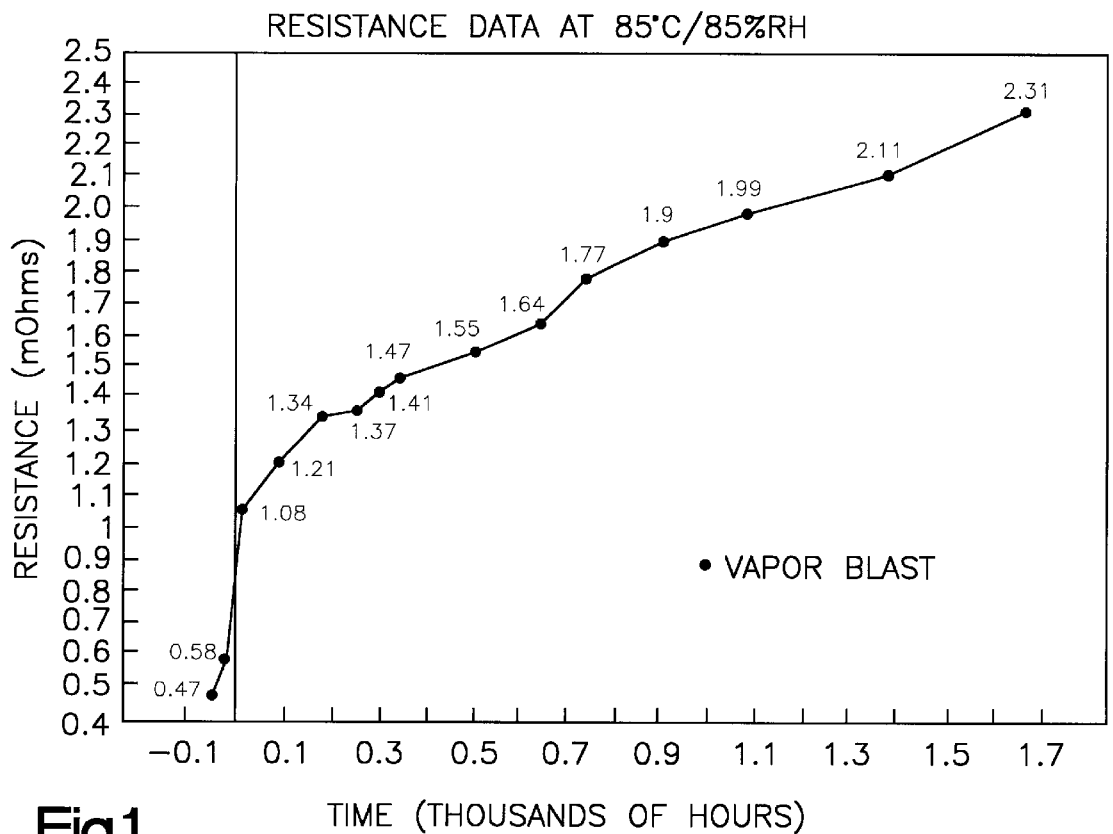
FIGS. 1 and 2 are a graphical representation of the results obtained in Example 1 discussed later in this specification.

Conductive bonding of thick metal backers or plates 10 onto a ground plane 12 of a printed circuit board 14 can be accomplished using a variety of conductive adhesives and for a variety of applications. The present invention provides an improved conductive interconnection between the TMB and the PCB by micro-roughening the connection surface 16 of the TMB before adhering together the TMB and PCB. In particular, this micro-roughening is best accomplished by a pressurized vapor-grit blasting to develop the roughened connection surface.

The surface of the ground plane that is to be bonded to the connection surface of the TMB can be of a metal such as copper, gold, palladium-nickel, tin-lead or tin. If copper is utilized for the ground plane, an oxide inhibiting treatment such as benzotriazole is beneficial, after an operation to remove surface oxide, in order to maintain low interfacial electrical resistance and good bond strength. Stability of electrical resistance and optimum bond strength and durability is obtained in a copper ground plane coated with tin. The tin may be coated over the copper ground plan plane by electroless, immersion or electrolytic deposit. The thickness of the coating can range from 20 $\mu$in to 250 $\mu$in or thicker, with optimum results occurring around 150 $\mu$in. Furthermore, improved bond resistance stability and durability is obtained by cleaning the tin prior to bonding, with a commercial tin conditioning solution such as PD510, manufactured by MacDermid. (Preferably containing a strong complexant for copper such as Thiourea).

Once the ground plane surface has been prepared for bonding, the connection surface of the TMB needs to be readied for adhering the TMB to the ground plane. While typical metals used for a TMB include copper, brass and aluminum, it is preferable to use aluminum for the TMB. However, it is contemplated that other metals could be used for the TMB of the present invention.

To prepare the connection surface of the TMB for microroughening, the connection surface is preferably first degreased. Isopropyl alcohol in an ultrasonic bath or accompanied by mechanical scrubbing has been demonstrated to be an effective degreasing treatment. It is contemplated that other such procedures using commercially available cleaners and solvents, such as acetone, are also acceptable. Following this degreasing, the connection surface of the TMB is micro-roughened.

The connection surface is vapor-grit blasted in order to achieve a TMB with a relatively uniform micro-roughened surface that has a relatively thin oxide layer. Roughness and total surface area of the connection surface appear to be important factors in bond integrity with a roughness in the range of 20 $\mu$in to 80 $\mu$in being suitable. While various methods exist for micro-roughening the connection surface, vapor blasting is preferred and yields the optimum results. Vapor blasting can be defined as spraying under pressure a fine grit abrasive suspended in a medium onto a surface using a spray processing tool which can be conveyorized. Preferably, the medium is aqueous. One such conveyorized spray processing device is a Liquid Honing Vapor Blast. Baseline conditions for this conveyorized spray processing device are about 70 to 80 psi spray pressure and 1 meter/minute conveyor speed. The spray pressure, however, may be in the range of about 65 to 150 psi while yielding the desired micro-roughened connection surface. Optimal results are obtained with a spray pressure of about 90 psi. The preferred abrasive materials are aluminum oxide or titanium oxide, in the form of a 320 mesh, present in an aqueous slurry at a concentration of about 12%–16% solids by weight. After vapor blasting, the connection surface should have a roughness in the range of about 30 $\mu$in to about 70 $\mu$in and a resulting oxide layer of 5–10 nm. Roughness is defined as the average peak to valley height taken across a sample area of the TMB connection surface.

The resulting micro-roughened connection surface of the TMB results in a reduction in resistance drift under conditions of high temperature and humidity. For example, under 85° C. and 80% relative humidity, reduction in resistance drift of a magnitude of 10X to 100X can be obtained over a 1000 hour time period for an aluminum TMB bonded to a PCB.

A wide variety of adhesives can be used to bond the TMB to the ground plane of the PCB. In one embodiment of the present invention, the adhesive is electrically conductive. These adhesives include, but are not limited to, isotropically conductive epoxies such as highly loaded silver-flake filled epoxies, such as, Ablestik 8175, anisotropically conductive epoxies, for example, epoxies loaded with silver plated nickel particles, silver or gold glass spheres, or thermoplastic-based conductive adhesives. Preferably, the present invention utilizes conductive epoxy materials in screenable paste form such as Ablestik 8175. Also, if the PCB and TMB are similar in their coefficient of thermal expansion ("CTE"), it is preferable for the adhesive to be closely matched in CTE to both the PCB and TMB. If the PCB and TMB differ substantially in CTE, it is preferable for the CTE of the adhesive to be intermediate to those of the PCB and TMB. Also, in one embodiment, the adhesive is an epoxy thermoset, but it is contemplated that other adhesives such as epoxy thermoplastics could be utilized.

The adhesive can be applied to either the surface of the PCB, the connection surface of the TMB or to both surfaces. Best results are obtained when the adhesive is applied to the connection surface of the TMB. Furthermore, the preferred method of applying the adhesive is a screening process in order to achieve coverage over the large area which is typical in card bonding applications. Other methods such as stenciling, however, are acceptable.

Thus, to produce the printed circuit board assemblies with thick metal back, the connection surface of the TMB is preferably degreased and then micro-roughened by a vapor-grit blast. Also, the surface ground plane of the PCB is preferably cleaned and oxide layers removed. Oxidation inhibiting treatments may also be beneficial. Once these pre-connection treatments are completed the electrically conductive adhesive is dispensed and the PCB and TMB are clamped together under pressure and then heated to cure the adhesive, resulting in an aluminum backed circuit with a conductive bond in which the TMB acts as a heat sink and shield plane or current-carrying plane.

The time between the micro-roughening treatment and the application of the adhesive should be kept to a minimum, and the bonding and curing operations should be performed soon after adhesive screening. Hold times are preferably less than four hours, but around eight hours is often acceptable. During hold time, however, environmental control of temperature and humidity is desirable to minimize degradation of the bonding surfaces. Also, clearance areas around the edges of the bonded areas and recessing of the adhesive from the edges of the PCB or TMB are often necessary to prevent excessive dispersment of adhesive during bonding and curing. Once the TMB and PCB have been treated and adhesive applied to one or both of the connection surface and the ground plane, the connection surface of the TMB is joined to the ground plane under pressure to form a TMB/adhesive bond/ground plane interface of a circuit board assembly. Also, once joined, the circuit board assembly is cured so that the adhesive forms a stable interconnection between the TMB and the PCB. Proper alignment of the PCB to the TMB is important and can be accomplished by mechanical means such as use of pins in common tooling holes, edge location, or optical registration.

The mating of the PCB to the TMB should be performed in a manner that minimizes entrapment of air in the bond. Air trapped in the bond can alter the electrical performance of a metal backed circuit especially in applications where localized grounding is required and critical. Also, trapped air can reduce the reliability of the bond and provide a conduit for the ingress of moisture resulting in accelerated hydrolysis of aluminum in the bonded areas. When the adhesive is applied to the TMB by screening, any air trapped when the PCB is mated to the TMB is generally found between the bonding surface on the board and the adhesive.

While numerous means exist to minimize entrapment of air, the most effective means of evacuating and minimizing entrapped air involve the use of vacuums. In one vacuum method, the assembly operation is carried out in a vacuum chamber. The PCB is aligned and mated to the TMB and then clamped in place while in the chamber. A vacuum lamination press can also be utilized. The minimization of air entrapment is best achieved by applying the vacuum before the application of pressure. This can be successfully accomplished in a system where the card is placed on the backer with no pressure other than the weight of the card, the assembly is placed under vacuum and pressure is then applied by inflating a bladder which applies pressure centrally first and then radiating outward toward the edges of the assembly.

The bonding and curing process is tailored to a given adhesive system with pressure being applied uniformly. The bonding pressure often is determinative of the mechanical durability and electrical stability of the conductive bond. The appropriate bonding pressure is related to the adhesive being used. For example, when the adhesive is an unstabilized silver flake-filled epoxy based system in paste form, very low pressure is optimal. Pressure required for these adhesives is in the range of about 0.8 to about 1.5 psi However, anisotropic conductive epoxies and conductive thermoplastic adhesives frequently require substantially more pressure. For these adhesives, pressure at 20 to 50 psi or higher would be common.

Adhesives requiring a higher pressure require bonding tooling such as flatbed or autoclave lamination press. Isotropically conductive adhesives that require low bonding pressure, however, can be bonded using a low pressure clamping device or a dead weight. While pressure applied is a function of the adhesive used, no matter what adhesive is chosen, the pressure should preferably be applied uniformly. Pressure uniformity is ensured by using an appropriate compliant press-pad material between the TMB and the pressure fixture with pressure supplied by a spring-loaded clamp or a weight. Best results have been achieved with a ⅛" rubber pad which helps eliminate voiding in the adhesive. With low pressure bonding processes, special care must be taken to eliminate entrapped air in the bond line. Methods include the previously mentioned use of a vacuum and applying pressure from the center and radiating outward using a bladder. Another method involves using a rolling device to force air out of the bond line. This rolling process could be performed manually, but would preferably be automated to control pressure and uniformity of the applied pressure.

Once the TMB and PCB have been joined, the rubber pad is placed within the clamp fixture so the TMB, PCB and pad are all placed together into the clamp. The clamp is closed to apply pressure, and the adhesive is cured by heating. The use of a small free-standing clamp enables curing of the adhesive in a conveyorized IR oven. This allows a high bonding process throughput and a rapid heating ramp-up rate. Rapid heating is preferable because slow heating allows excessive bleed out of the adhesive which can interfere with component assembly surfaces and can increase resistance instability of the bond. The preferred temperature ramp rate for the Ablestick 8175 adhesive is about 10 to about 12° C./min to cure temperature of about 130 to about 165° C. for a cure time of about 25 to about 45 minutes. A preferred cure temperature has been found to be about 150° C.

In order to more thoroughly illustrate the present invention, the following example was constructed. The electrical properties of the bond formed between the connection surface of an aluminum TMB and the tin-plated copper ground plane of the PCB were tested by measuring electrical resistance as a function of time. The TMB and PCB were bonded together according to the above explained invention. The electrical properties were tested by placing the circuit board assembly in a chamber maintained at 85° C. and 80% relative humidity. Resistance was measured for periods of up to 800 hours to determine the effect of high humidity conditions on the electrical properties of the invention. Also, the experiment in each example was repeated a number of times to insure reliability, and in some instances testing was confirmed for over 4000 hours.

EXAMPLE 1

Figure 2:
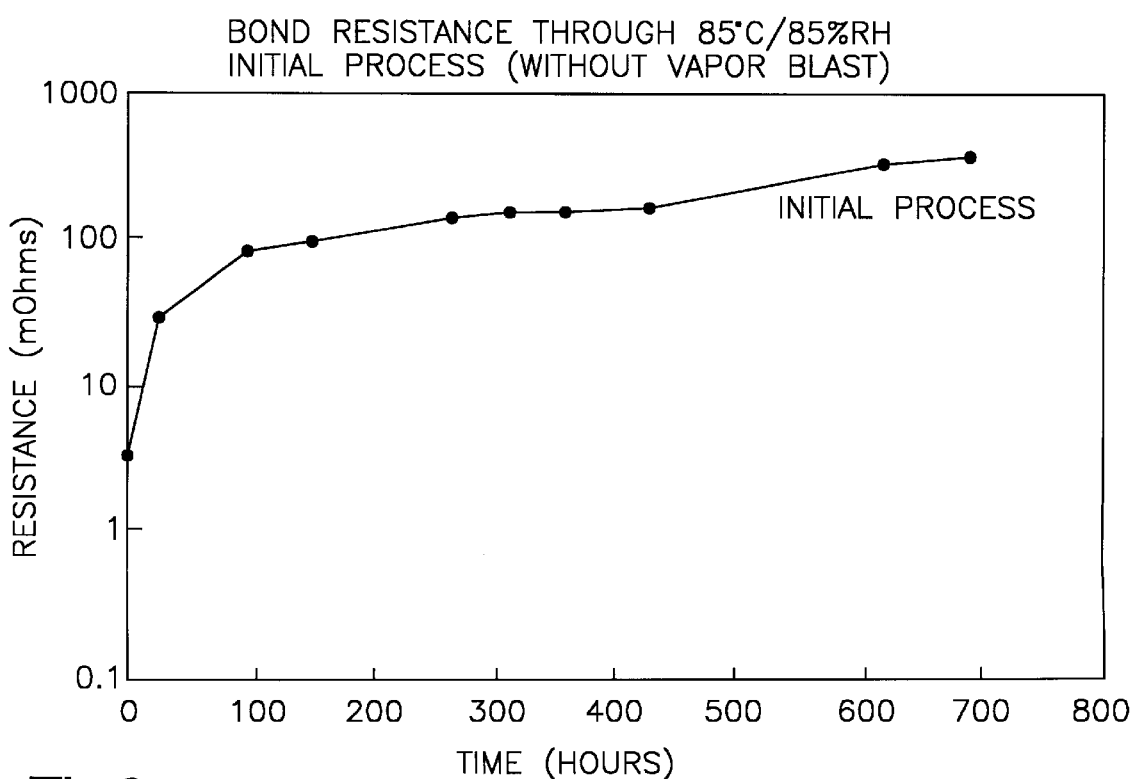
Figure 3:
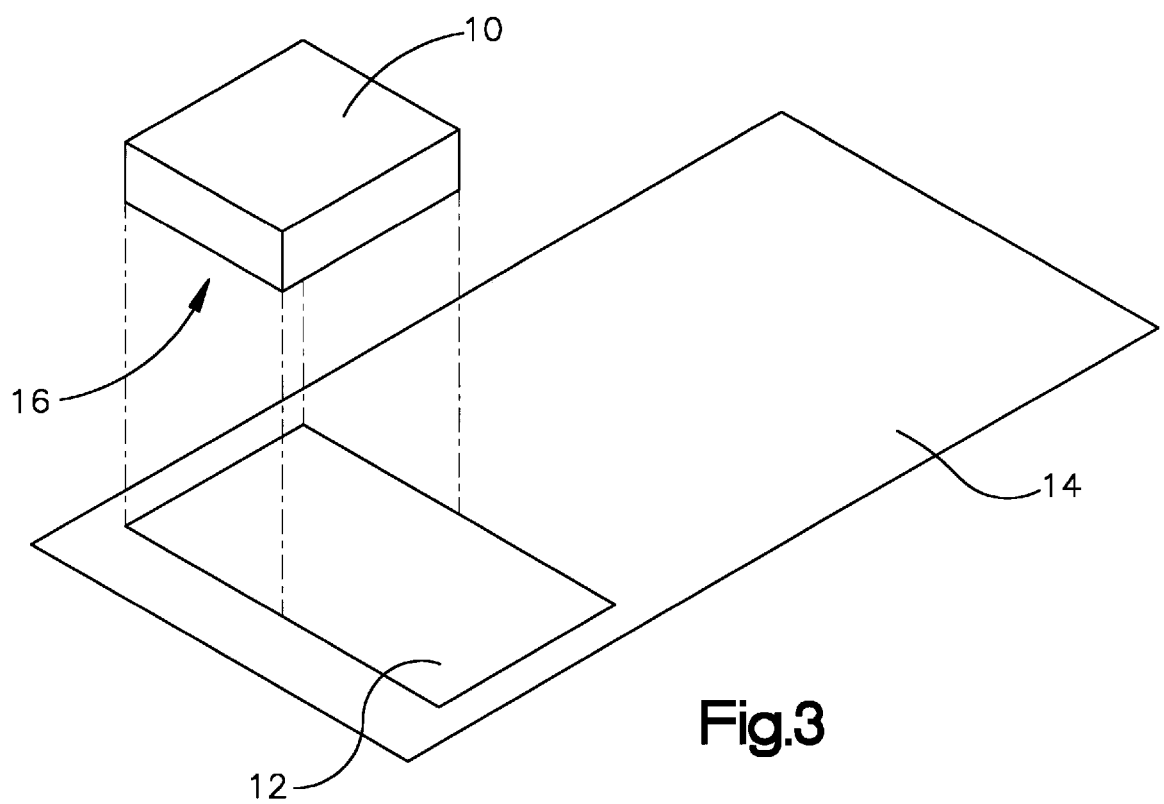
FIG. 3 shows the printed circuit board and the metal substrate before they are bonded together.

In this example, one set of circuit board assemblies ("sample 1") was formed with a vapor blast treatment of the aluminum connection surface prior to bonding while a second set of circuit board assemblies ("sample 2") was formed without the vapor blast treatment. The comparison of the electrical properties of the two sample populations is illustrated in FIGS. 1 and 2. Sample 1 was formed with an electroplated tin ground plane. The TMB was degreased and grit-blasted at about 90 PSI yielding an average peak to valley roughness of 30 to 70 μin. The TMB was attached to the ground plane of sample 1 with Ablestick 8175, placed in a clamping fixture and cured for 50 minutes at a peak cure temperature of 180° C. down to 150° C. Sample 2 was prepared in the same manner as sample 1 except that the TMB was not vapor grit blasted prior to bonding. Once the samples were formed their resistance over time while exposed to 80% relative humidity and 85° C. was tested.

As shown in these FIGS. 1 and 2, the initial resistance of both samples was virtually identical at about 2 milliohms. While the resistance in the vapor blasted sample remained relatively constant over time, the sample bonded without micro-roughening the connection surface of the TMB had an large increase in resistance over time. The sample treated with the vapor blast had a approximately 10X improvement in bond resistance stability compared to the untreated sample.

Although only a few embodiments of the present invention have been described above, it should be appreciated that many modifications can be made without departing from the spirit and scope of the invention. For example, although aluminum has been described above as the metal for the TMB, it should be appreciated that the present invention can be used for bonding any type of electrically conductive metal used for thick metal backs. All such modifications are intended to be included within the scope of the present invention, which is to be limited only by the following claims.

We claim:

1. An electrical component device comprising:

a printed circuit board having an external ground plane therein;

a metal substrate having a connection surface vapor grit blasted such that said connection surface has a roughness of between 20 $\mu$in. to 80 $\mu$in., and has an oxide layer of between 5 and 10 nm;

said connection surface adhered under pressure to said external ground plane with an electrically conductive adhesive to form a circuit board assembly; and said circuit board assembly cured at a temperature of at least 130° C. and no more than 165° C.

2. The electrical component device of claim 1 further comprising:

a cure temperature ramp rate of at least 10° C. per minute and no more than 12° C. per minute.

3. The electrical component device of claim 2 wherein said circuit board assembly is cured for at least 25 minutes and no more than 55 minutes.

4. The electrical component device of claim 1 wherein said metal substrate is aluminum.

5. The circuit board device of claim 1 wherein said adhesive is a non-silicone based organic polymer.

* * * * *